United States Patent [19]

Ernst et al.

[11] Patent Number: 5,592,132

[45] Date of Patent: Jan. 7, 1997

[54] FREQUENCY MODULATOR COMPRISING AN ADJUSTING CIRCUIT

[75] Inventors: Holger Ernst; Holger Moll, both of Hamburg, Germany

[73] Assignee: U.S. Philips Corporation, New York, N.Y.

[21] Appl. No.: 433,666

[22] Filed: May 4, 1995

[30] Foreign Application Priority Data

May 6, 1994 [DE] Germany .................. 44 15 989.7

[51] Int. Cl.⁶ .............. H03C 3/00; H03C 3/08; G11B 20/06
[52] U.S. Cl. .............. 332/117; 332/124; 360/30; 455/44; 455/110; 386/26
[58] Field of Search ................... 358/310, 330, 358/315, 327, 329; 360/29–30; 332/117, 123, 124; 331/10, 20; 455/42–45, 63, 110–113

[56] References Cited

U.S. PATENT DOCUMENTS

| | | | |
|---|---|---|---|
| 4,554,517 | 11/1985 | Parniere et al. ................ | 455/44 X |
| 4,839,615 | 6/1989 | Sato ................................ | 332/117 |
| 4,918,529 | 4/1990 | Douziech et al. ................ | 358/174 |
| 5,157,359 | 10/1992 | Nogami et al. .................. | 332/117 |
| 5,517,159 | 5/1996 | Hwang ............................ | 455/110 X |

Primary Examiner—David Mis
Attorney, Agent, or Firm—Bernard Franzblau

[57] ABSTRACT

In a frequency modulator (1) having an adjusting circuit by which frequency modulator an applied luminance signal of a color video signal that contains synchronization pulses is frequency modulated, while the chrominance signal of the color video signal is modulated on a carrier, that has a quiescent frequency if no color information is available. A capacitor is provided for an automatic mode of operation, and is charged or discharged, respectively, in dependence on the period duration of the modulator output signal and in dependence on the period duration of the quiescent frequency of the chrominance carrier. The steepness of the voltage/frequency characteristic curve of the modulator is set dependent upon the charge condition of the capacitor, while the charging-to-discharging ratio is selected such that the charge of the capacitor is maintained constant on average, if the modulator frequency is equal to a predefined nominal frequency and increases or decreases, respectively, if the modulator frequency falls short of or exceeds the nominal frequency during the synchronization pulses.

13 Claims, 3 Drawing Sheets

FREQUENCY MODULATOR COMPRISING AN ADJUSTING CIRCUIT

BACKGROUND OF THE INVENTION

1. Field of the Invention

This invention relates to a frequency modulator comprising an adjusting circuit, by which frequency modulator an applied luminance signal of a color video signal that contains synchronization pulses is frequency modulated, while the chrominance signal of the color video signal is modulated on a carrier for which there is provided a reference frequency.

Such frequency modulators are installed in video recorders in which the luminance signal of a color video signal is converted into a frequency modulated signal by the frequency modulator and is recorded in that form. Usually the frequencies and the frequency deviation for this frequency modulation are exactly laid down in the specifications of the recording standard. For tapes recorded in this manner to be exchanged between various devices, these specifications should be exactly followed. The tolerances of these frequencies are so narrow that they cannot be satisfied in an integrated circuit without further measures being taken. For example, the VHS standard prescriber 3.8 MHz for the instantaneous frequency during the synchronization pulses and 4.8 MHz for white picture information.

2. Description of the Related Art

Therefore, in prior-art circuit concepts two adjusting points are provided, that is to say, for separately adjusting the frequency for the synchronization pulses and for the white picture information. This adjustment may optionally be effected on the chip during the manufacture of the IC. However, this is detrimental in that the circuit cannot be adjusted in its future environment within the apparatus with the temperature, voltage and further influences prevailing there and, therefore, in the end this is not very accurate.

U.S. Pat. No. 4,918,529 discloses an adjusting circuit for a modulator, for the operation of which adjusting circuit, a separate pulse is fed into the video signal, which pulse adopts certain voltage conditions on the basis of which the modulator is adjusted. The disadvantage of this circuit arrangement is mainly that an additional pulse is to be generated, fed and, thereafter, identified at the adjustment.

SUMMARY OF THE INVENTION

It is an object of the invention to provide a frequency modulator comprising an adjusting circuit, which circuit operates automatically and renders redundant, during manufacture, an adjustment of the ICs which include the frequency modulator and adjusting circuit.

This object is achieved according to the invention, in that the adjusting circuit includes a capacitor which is charged or discharged, respectively, in dependence on the period duration of the modulator output signal and in dependence on the period length of the reference frequency of the chrominance carrier, and the steepness of the voltage/frequency characteristic curve of the modulator is set in dependence on the capacitor charge condition, while the ratio between the charging and the discharging operations is selected such that the charge of the capacitor is maintained constant on average, if the modulator frequency is equal to a predefined nominal frequency and increases or decreases, respectively, if the modulator frequency drops below or exceeds the nominal frequency during the synchronization pulses.

For the frequency modulator according to the invention comprising an adjusting circuit, the input voltage/frequency characteristic curve of the frequency modulator is set in dependence on the voltage of a capacitor included in the adjusting circuit.

During each synchronization pulse of the color video signal this capacitor is charged or discharged for various lengths of time. The charge value of the capacitor remaining after the synchronization pulse then determines the transconductance of the frequency modulator. This procedure is repeated at each synchronization pulse.

In order to set this characteristic curve, on the one hand, the period duration of the modulator output signal and, on the other hand, the period duration of the chrominance carrier reference frequency of the color video signal, are used. For the color video signal, there is a strictly limited reference frequency, which, as a result, has constant and known period durations. This reference frequency is laid down in the chrominance signal transmission standard and is transmitted in a chrominance carrier burst which has this reference frequency. According to the invention, a specific number of periods of the modulator output signal and a specific number of periods of the signal having the chrominance carrier quiescent frequency are used for charging or discharging the capacitor during these periods. The period durations ie., the multiples of the periods of these two signals on the one hand and the charging and discharging currents for the capacitor, on the other, are to be selected such that the modulator frequency is set to the nominal frequency. For this purpose, the charge of the capacitor is to remain constant if the modulator frequency is equal to a predefined nominal frequency. Depending on the input voltage/frequency characteristic curve, the charge of the capacitor is to rise or fall, respectively, if the modulator frequency during the synchronization pulses is smaller or larger than the nominal frequency.

As a result, the voltage of the capacitor is set via the frequency and thus the period duration of, on the one hand, the modulator output signal and, on the other hand, the constant reference frequency of the chrominance carrier, so that the modulator characteristic curve adopts the desired pattern. No adjustment is needed for this purpose, because during each synchronization pulse, the frequencies and thus the period durations of these two signals are continuously compared and the charge of the capacitor and thus the modulator characteristic curve is set in dependence on this frequency comparison.

The modulator characteristic curve is set here at only one point, that is, during the synchronization pulses. It is not necessary Per Se to adjust the modulator frequency in the case of white picture information of the video signal because the ratio between these two frequencies is fixed and the frequency modulator or its characteristic curve may be arranged such that this ratio is adhered to very accurately. Modulators operating so accurately are already known in the state of the art.

In this way the adjusting circuit of the frequency modulator can, depending on how the capacitor is connected, be arranged in such a way that for example, during charging operations, the charge of the capacitor rises or falls when, during the synchronization pulses, the modulator frequency is smaller than the nominal frequency. This similarly holds for the discharging operations. The only decisive factor is then that in the case where the modulator frequency is smaller than the nominal frequency, the charge of the capacitor is changed in the reverse direction to the case where the modulator frequency is larger than the nominal frequency.

According to an embodiment of the invention, means are provided for the frequency modulator which generate two pulses during each synchronization pulse of the video signal, of which a first pulse has a duration corresponding to the duration of a predefined first number of periods of the reference frequency of the chrominance carrier, and a second pulse has a duration corresponding to the duration of a predefined second number of periods of the modulator output signal, in that the first and second numbers are selected such that within the permitted frequency deviation of the FM modulator, always the first or second pulse is longer than the other pulse, in that during the periods of time in which the longer pulse but not the shorter pulse occurs, a capacitor, included in the adjusting circuit, is charged by a first current source, in that means are provided which discharge the capacitor via a second current source for a duration of a predefined third number of periods either of the oscillator signal or of the reference frequency of the chrominance carrier, in that the first, second and third numbers of periods and the current sources are selected or arranged such that during the synchronization pulses, the charge of the capacitor is maintained constant on average, by the current sources if the modulator frequency is equal to a predefined nominal frequency, and rises or falls, respectively, if the modulator frequency is smaller or larger than the nominal frequency during the synchronization pulses.

Specially generating these pulses provides that the duration of the charging operation is determined in the end by how large the difference is between the durations of predefined-numbers of periods of the quiescent frequency of the chrominance carrier and of the output signal of the modulator, respectively. The duration of the charging operation is finally determined by the frequency difference between these two signals, and thus by the deviation of the modulator output signal during the synchronization pulse from the nominal frequency. For the discharging operation, there is also a certain number of periods available of either of the two signals. The different durations, thus especially the numbers of periods for both the charging and discharging operations, and the levels of the currents for the charging and discharging operations are to be arranged such that the charge of the capacitor remains constant on average, if the modulator frequency is equal to the predefined nominal frequency and increases or decreases, respectively, if the modulator frequency during the synchronization pulses is smaller or larger than the nominal frequency.

Finally, by simply counting predefined numbers of periods, the capacitor is charged or discharged in a predetermined manner during these periods. If the output frequency of the modulator is equal to its nominal frequency, the duration of these pulses and the current strength during charging or discharging are such that during the synchronization pulse and after the capacitor has been charged or discharged, the charge of the capacitor remains constant. If deviations occur from this state of balance, for example, if the modulator frequency deviates downwards, a charging pulse will be shorter or longer and the charge of the capacitor will change accordingly. This change of charge will accordingly modify the modulator characteristic curve.

The central idea of the invention is thus finally a type of frequency comparison of the modulator output frequency with the reference frequency of the chrominance carrier of the color video signal. As a result of this frequency comparison, there may be established, during the synchronization pulses, whether the frequency difference between these two signals corresponds to a nominal value the difference is to have if the modulator output frequency is equal to its nominal frequency. If this is not the case, the charging and discharging operations are controlled so that the charge of the capacitor changes and thus the steepness of the modulator characteristic curve. A steady state in which the modulator produces a nominal frequency output signal during the synchronization pulses will be regained via the adjustment of the modulator characteristic curve.

BRIEF DESCRIPTION OF THE DRAWINGS

Hereinbelow, an exemplary embodiment of the invention will be further explained with reference to the drawings, in which.

DESCRIPTION OF THE PREFERRED EMBODIMENT

Figure 1:
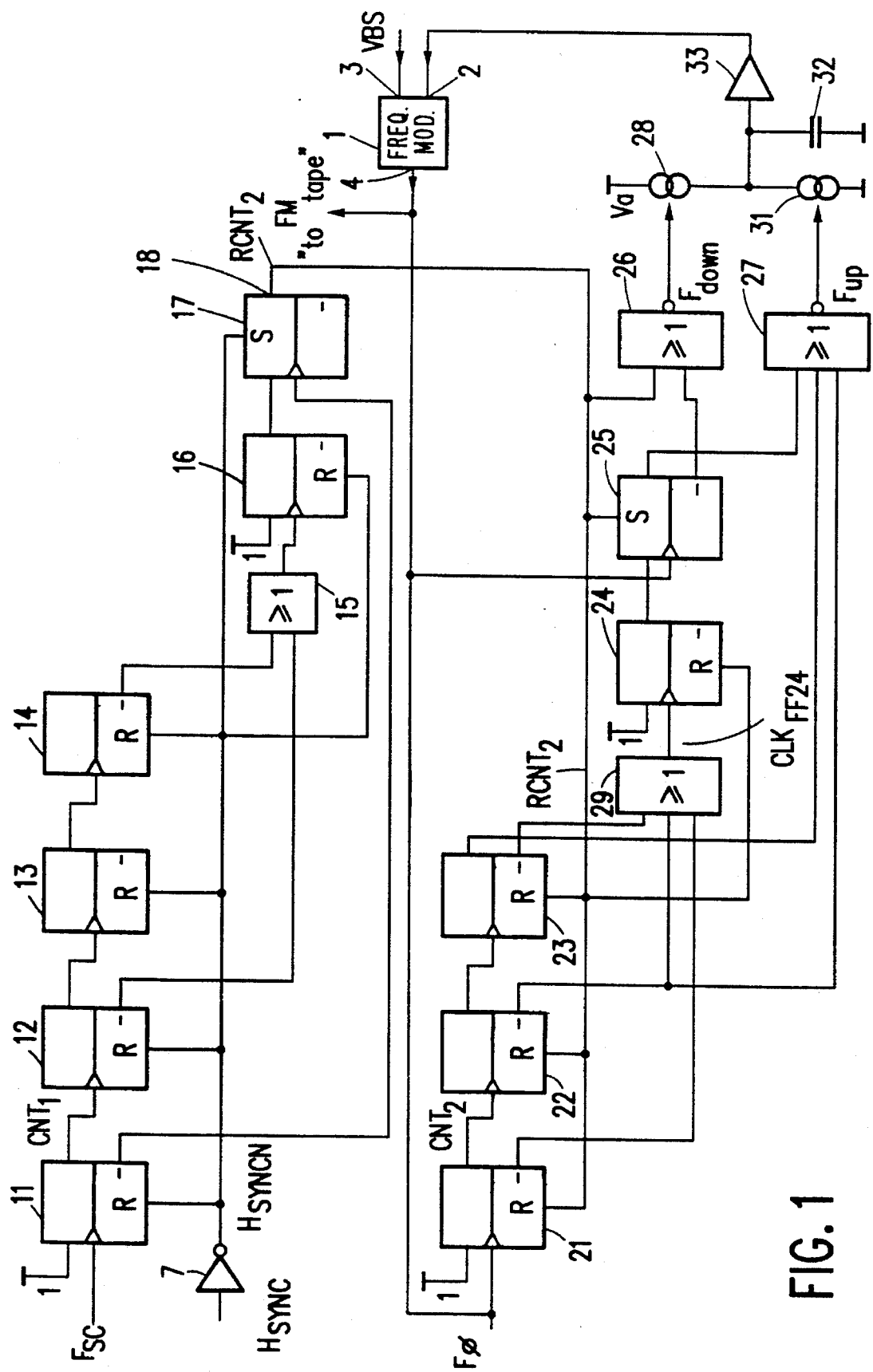
FIG. 1 shows a block circuit diagram of a frequency modulator according to the invention, comprising an adjusting circuit.

In FIG. 1 is shown a frequency modulator 1 according to the invention, comprising an adjusting circuit.

The adjusting circuit is used for setting the steepness of the input voltage/frequency characteristic curve of the FM modulator 1. This adjusting operation may be effected on the FM modulator 1 via a signal present on its input 2. The FM modulator 1 has a further input 3 through which it is supplied with a luminance signal VBS of a color video signal. This luminance signal also contains the synchronization pulses occurring in the color video signal. The modulator 1 has an output 4 on which it supplies the modulated luminance signal. In FIG. 1 this signal is referenced $F_O$. This signal may be recorded on tape in a video recorder which is referenced FM "to tape" in FIG. 1.

The circuit arrangement shown in FIG. 1 includes four flip-flops 11, 12, 13 and 14 which together make up a first counter referenced $CNT_1$ in the drawing Figure.

The flip-flops 11 to 14 are negative edge-triggered as are all further flip-flops in the circuit shown in FIG. 1.

The clock input of the first flip-flop 11 of the counter is supplied with a signal referenced $F_{SC}$ in the drawing Figure, which relates to the chrominance carrier reference frequency of the color video signal, whose luminance signal is rendered available to the FM modulator 1 on its input 3. The chrominance signal transmission standards always contain a chrominance carrier reference frequency. This reference frequency is transmitted in the color television receiver by means of a color burst which has the reference frequency. Normally, the signal processing of the receiver comprises a quartz oscillator which is synchronized with the reference frequency via this color burst. The output signal of the quartz oscillator synchronized with the chrominance carrier reference frequency may advantageously be used for the circuit arrangement according to the invention.

The flip-flops 11, 12, 13 and 14 are arranged in series as a counter ie., the output of the preceding flip-flop is connected to the clock input of the next flip-flop. The reset input R of each of these flip-flops 11 to 14 is supplied with the inverted synchronizing signal of the color video signal which is referenced $H_{SYNCN}$ in the drawing Figure.

The output signals of the inverting outputs of the flip-flops 12 and 14 are applied to an OR gate 15 whose output signal is applied to the clock input of a flip-flop 16, whose input is fixedly set to a "high" level. The reset input R of the flip-flop 16 is also supplied with the inverted horizontal synchronizing signal $H_{SYNCN}$.

The non-inverting output of the flip-flop 16 is connected to an input of a further flip-flop 17 which is timed with the inverted output signal of the flip-flop 11. The flip-flop 17 has a set input S which is supplied with the signal $H_{SYNCN}$.

As a result of this connection of the counter, which comprises the flip-flops 11, 12, 13 and 14, and the further decoding by the OR gate 15 and the flip-flops 16 and 17, an output signal $RCNT_2$ is decoded on the output 18 of the flip-flop 17, which signal triggers a pulse that is 10 periods of the chrominance carrier signal $F_{SC}$ wide after each negative slope of the signal $H_{SYNCN}$, while this pulse commences at the next falling edge of the signal $F_{SC}$ after the start of the synchronization pulse in the signal $H_{SYNCN}$. These correlations will be further explained hereinbelow with reference to the time diagram of FIG. 2.

The output signal of the flip-flop 17, which signal is referenced $RCNT_2$ in the drawing Figure, is applied to reset inputs of three further flip-flops 21, 22 and 23 which collectively form a second counter referenced $CNT_2$ in the drawing Figure.

The clock input of the flip-flop 21 of this counter is supplied with the output signal $F_0$ of the FM modulator 1. The output of the flip-flop 21 is connected to the clock input of the flip-flop 22 and the output of this flip-flop is connected to the clock input of the flip-flop 23.

An OR gate 29 is provided whose inputs are supplied with the inverted output signals of the flip-flops 21, 22 and 23. The output signal of this OR gate, which signal is referenced $CLK_{FF24}$ in the drawing Figure, is applied to the clock input of a further flip-flop 24 whose input is fixedly set to the "high" level and whose reset input is supplied with the signal $RCNT_2$. The non-inverting output of this flip-flop is connected to an input of a flip-flop 25, which flip-flop is timed with the output signal $F_0$ of the FM modulator 1. A set input S of the flip-flop 25 is supplied with the output signal $RCNT_2$ of the flip-flop 17.

An OR gate 26 is provided which has an inverting output which supplies a signal referenced $FO_{down}$ in the drawing Figure. Furthermore, an OR gate 27 is provided which also supplies an inverted output signal referenced $FO_{up}$, in the drawing Figure.

The two inputs of the OR gate 26 are supplied with the inverted output signal of the flip-flop 25 and with the output signal $RCNT_2$ of the flip-flop 17.

The OR gate 27 is supplied with the non-inverted output signal of the flip-flop 25, the non-inverted output signal of the flip-flop 23 of the second counter and with the inverted output signal of the flip-flop 22 of this counter.

The OR gate 26, 27, respectively, supplies output signals by which current source 28, 31, respectively, is controlled. A capacitor 32 is charged or discharged by these current sources. The charge condition of this capacitor 32 reaches the input 2 of the FM modulator 1 via an operational amplifier 33. The steepness of the voltage/frequency characteristic curve of the FM modulator 1 is thus controlled in response to the charge condition of the capacitor 32.

The mode of operation of the circuit shown in FIG. 1 will be further explained with reference to FIG. 2 which represents time diagrams of several signals of the arrangement shown in FIG. 1.

The first counter $CNT_1$ with its four flip-flops 11 to 14 can, in essence, count up to 16. The synchronizing signal shown in FIG. 2 as $H_{SYNC}$ is inverted by the inverter 7, so that each synchronization pulse shows up as a negative pulse. As this inverted Signal is applied to the reset inputs of the flip-flops 11 to 14, the first counter is capable of counting only during such a pulse. The signal $F_{SC}'$, which is also shown in FIG. 2, is counted. In the exemplary case shown in FIG. 2, the pulse of the signal $H_{SYNC}$ is so wide that the counter counts up to 13 and is then reset again.

At the first negative edge of the signal $F_{SC}$ after the negative edge of the signal $H_{SYNCN}$, the first flip-flop 11 of the first counter 1 is set to 1 and the counting operation commences. Simultaneously, the signal $RCNT_2$ on the output 18 of the flip-flop 17 changes to the "low" level. Due to the decoding by the OR gate 15, this pulse is terminated when the count of 11 is reached and the signal $RCNT_2$ changes to the "high" level again. The pulse of the signal $RCNT_2$ thus has a width of 10 periods of the signal $F_{SC}$ which has a frequency corresponding to the quiescent frequency of the chrominance carrier of the color video signal.

The second counter $CNT_2$ is timed with the output signal $F_0$ of the modulator 1. The counter has now only three flip-flops and can thus count to a maximum from 0 to 7. The count 7, thus the maximum count, is decoded by the OR gate 29. The flip-flop 24 is timed with this decoded 7. This is denoted by the signal $CLK_{FF24}$ in FIG. 2. The flip-flop 24 was previously reset by $RCNT_2$ and is set by the edge of the signal $CLK_{FF24}$. Since a "high" signal is available on the data input, this condition will not change until the flip-flop is reset by $RCNT_2$.

Flip-flop 25 is initially set ie., after the high-low edge of the signal $RCNT_2$. At the next negative edge of the signal $F_0$, the flip-flop 25 is reset. When the count 7 is reached, a "high" signal is present on its data input, so that the flip-flop 25 is set again at the 8th negative edge of the signal $F_0$. As a result, the pulse of signal $Q_{FF25}$ has a width of 7 periods of the output signal $F_0$ of the modulator 1. If the end of the pulse of the output signal of the flip-flop 17 $RCNT_2$ occurs before that instant, flip-flop 25 will then already be set and the width of 7 periods of the output signal $F_0$ of the modulator 1 will not be reached.

Figure 2:
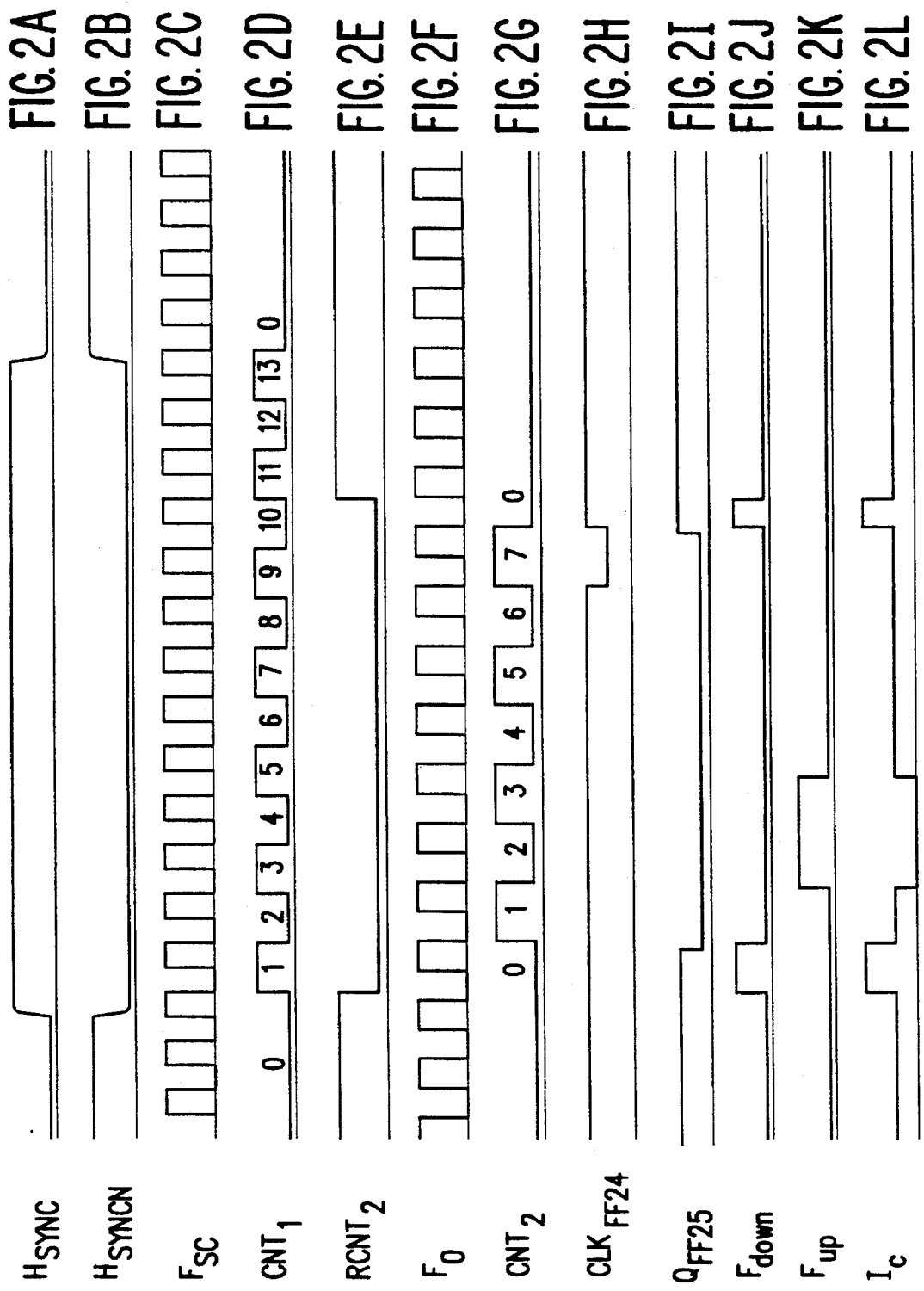
FIG. 2 shows a time diagram of signals in the circuit as shown in FIG. 1.

The signal $F_{down}$ shown in FIG. 2 is produced as a result of the further decoding by the OR gate 26. This signal is decoded in such a way that $F_{down}$ during a pulse $H_{SYNCN}$ contains a pulse only if a pulse occurs in the signal $RCNT_2$, but not in $Q_{FF25}$, thus if $RCNT_2$ has a "low" level, whereas $Q_{FF25}$ has a "high" level. In the case of an exemplary embodiment shown in FIG. 2, this happens during two periods of time in which the signal $F_{down}$ contains two pulses then. Depending on the extent of the frequency difference between $F_{SC}$ and $F_0$ and thus on the different duration of the 10 periods of the signal $F_{SC}$ and the 7 periods of the signal $CNT_2$, these pulses are longer or shorter. It will be evident that in the circuit arrangement shown in FIG. 1, the current source 28 is driven for a shorter or longer period of time depending on the period duration of the signal $F_0$ relative to the signal $F_{SC}$, so that the charge of the capacitor 32 is influenced accordingly. The discharging operation via the current source 31 is effected in dependence on the signal $F_{up}$. The signal $F_{up}$ is decoded from the counts of the second counter by the OR gate 27, so that it has a width of 2 periods of the signal $F_0$. During this period of time, the capacitor 32 in the arrangement shown in FIG. 1 is discharged via the current source 31. These periods of time, that is, the 10 periods of the signal $F_{SC}$ minus the 7 periods of the signal $F_0$, on the one hand, and the discharging time of 2 periods of the signal $F_0$, on the other, as well as the magnitude of the currents of the current sources 28 and 31, are arranged such that if the signal $F_0$ has a nominal frequency, the charge value of the capacitor 32 is maintained on average. However, if the signal $F_0$ has too small a frequency, the pulses of the signal $F_{down}$ become longer. This means that the current source 28 is switched on for longer periods of time within every synchronization pulse, so that the charge of the capacitor 32 rises on average. Via the control input 2 of the modulator 1, the steepness of the modulator voltage/frequency characteristic curve is corrected accordingly. Due to this correction, the frequency $F_0$ drops again, so that again the steady state is reached. The reverse holds if the frequency $F_0$ drops below the nominal frequency. These correlations are shown in FIG. 2 in the time diagram $F_{down}$ and $F_{up}$. The time diagram $I_C$ shows the charging current and discharging current of the capacitor 32.

This charging, discharging operation of the capacitor 32 is effected only during a synchronization pulse of the signal $H_{SYNCN}$, $H_{SYNC}$, respectively.

Needless to observe that it is alternatively possible to have different period values from those selected in this exemplary embodiment. However, the ratio between the charging and discharging currents is always to be such that if the output signal of the modulator 1 has its nominal frequency, the charge condition of the capacitor 32 remains constant on average.

Figure 3:
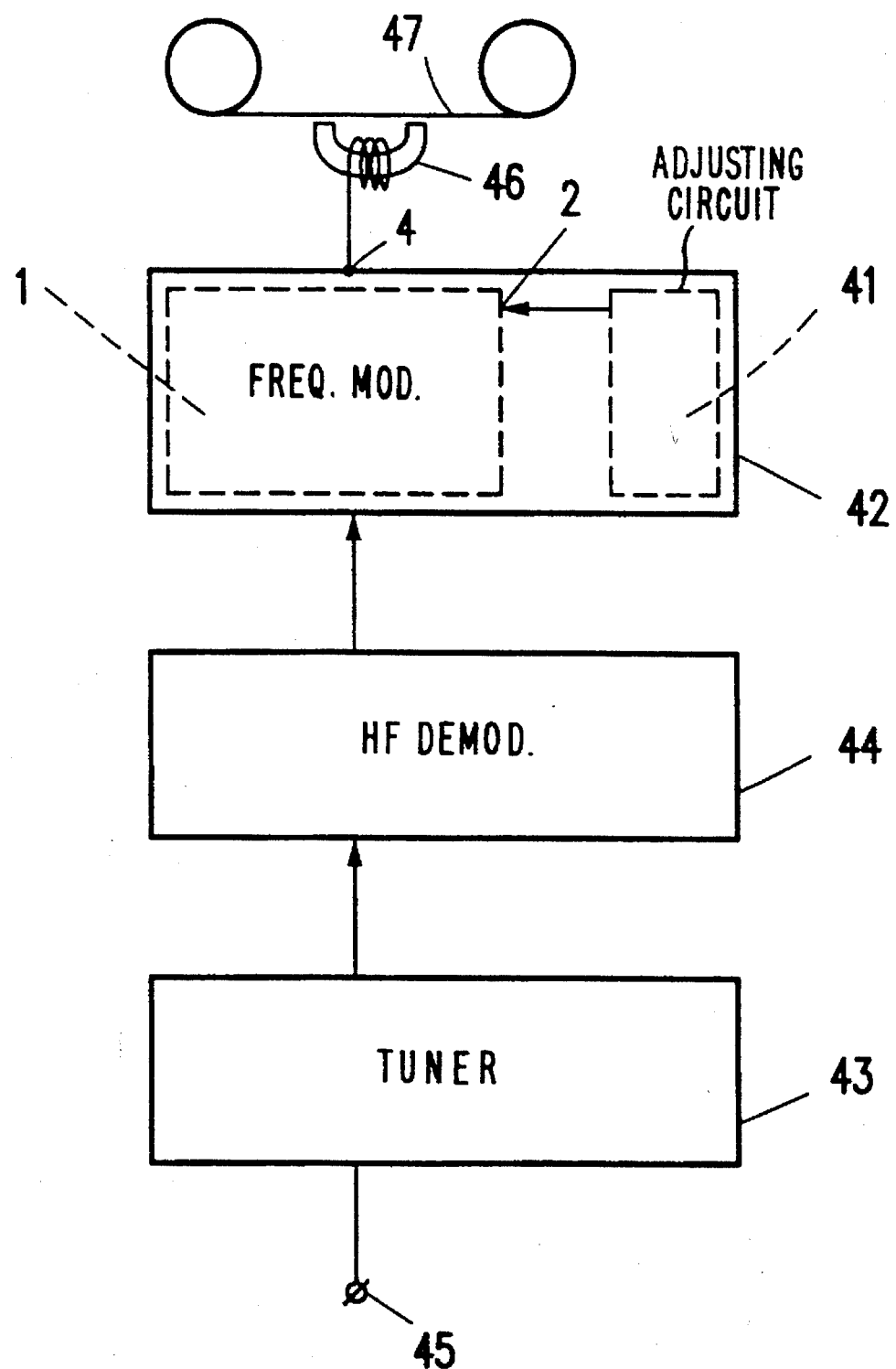
FIG. 3 shows a block circuit diagram of a video recorder comprising a frequency modulator with an adjusting circuit as shown in FIG. 1.

A video recorder diagrammatically shown in FIG. 3 has a HF antenna input 45 which is supplied with signals that have been modulated on various frequencies and come from television transmitters. The antenna input 45 is followed by a tuning unit 43 which has for its task to tune in on a frequency of one of these signals. The output signal of the tuning unit 43 reaches a HF demodulator 44 in which the received picture signal modulated on a HF carrier is converted to a baseband signal, is thus demodulated. In the arrangement according to FIG. 3 the luminance signal of this video signal is fed to the circuitry unit which comprises an FM modulator 1 as well as an adjusting circuit 41. The signal is then signal VBS of FIG. 1.

Also, according to FIG. 1, there is shown the input 2 of the modulator 1 through which a signal can be applied to the modulator by which signal the steepness of the input voltage/frequency characteristic curve of the FM modulator 1 can be set. The FM modulator 1 as well as the adjusting circuit 41 operate in accordance with the arrangement shown in FIG. 1 and FIG. 2.

The output signal of the FM modulator 1 is available at an output 4 of the FM modulator 1 or circuitry unit 41, respectively. From there it goes to a video head 46 diagrammatically shown in FIG. 3. The signal modulated on an FM frequency is recorded by the video head 46 on a magnetic tape 47 which is moved relative to the video head by a drive mechanism that is not further shown in FIG. 3.

We claim:

1. A frequency modulator comprising:
   a frequency modulator which frequency modulates an applied luminance signal of a color video signal that contains synchronization pulses, while the chrominance signal of the color video signal is modulated on a carrier provided with a reference frequency, an adjusting circuit which includes a capacitor which is charged or discharged, respectively, in dependence on the period duration of the modulator output signal and in dependence on the period length of the reference frequency of the chrominance carrier, and the steepness of the voltage/frequency characteristic curve of the frequency modulator is set dependent upon the capacitor charge condition, the ratio between the capacitor charging and discharging operations is selected such that the charge on the capacitor is maintained constant on average if the modulator frequency is equal to a predefined nominal frequency and increases or decreases if the modulator frequency drops below or exceeds the nominal frequency, respectively, during the synchronization pulses.

2. A frequency modulator as claimed in claim 1, wherein the adjusting circuit includes means for generating two pulses during each synchronization pulse of the video signal, of which a first pulse ($RCNT_2$) has a duration corresponding to the duration of a predefined first number of periods of the reference frequency of the chrominance carrier and a second pulse ($Q_{FF25}$) has a duration corresponding to the duration of a predefined second number of periods of the modulator output signal, in that the first and second numbers are selected such that within the permitted frequency deviation of the FM modulator always the first or second pulse is longer than the other pulse, in that during the periods of time in which the longer pulse but not the shorter pulse occurs, the capacitor included in the adjusting circuit is charged by a first current source, means for discharging the capacitor via a second current source for a duration of a predefined third number of periods either of an oscillator signal synchronized with the chrominance carrier reference frequency or of the reference frequency of the chrominance carrier, wherein the first, second and third numbers of periods and the current sources are selected or arranged such that, during the synchronization pulses, the charge on the capacitor is maintained constant on average by the first and second current sources if the modulator frequency is equal to the predefined nominal frequency, and rises or falls respectively, if the modulator frequency is smaller or larger than the nominal frequency during the synchronization pulses.

3. A frequency modulator as claimed in claim 1, wherein the first and the second number of periods are selected such that the first pulse within the permitted frequency deviation of the FM modulator is always longer than the second pulse.

4. A frequency modulator as claimed in claim 1, wherein the first number is ten and the second number is seven.

5. A frequency modulator as claimed in claim 2, wherein the third pulse has a time length equal to two periods of the modulator output signal.

6. A frequency modulator as claimed in claim 2, wherein the first pulse commences at a first falling edge of the oscillator output signal after the leading edge of a synchronization pulse.

7. A frequency modulator as claimed in claim 2, wherein the second pulse commences at the next falling edge of the modulator output signal after the start of the first pulse.

8. A frequency modulator as claimed in claim 2, wherein a third pulse commences at the next falling edge of the modulator output signal after the start of the second pulse.

9. A video recorder comprising a frequency modulator as claimed in claim 1 for recording on a record carrier the luminance signal modulated by the frequency modulator.

10. A frequency modulator as claimed in claim 1 wherein the adjusting circuit comprises:
    means responsive to a first sequence of pulses produced by the frequency modulator and a second sequence of pulses determined by the chrominance carrier reference frequency for generating, during each synchronization pulse of the color video signal, first and second pulses of a first and second duration determined by the period duration of the chrominance carrier reference frequency and the period duration of the modulator output signal, respectively, and first and second current sources coupled to the capacitor for charging and discharging the capacitor, the first and second current sources being controlled by said first and second pulses to control the capacitor charge and discharge time so as to maintain the capacitor charge constant on average at a value at which the modulator frequency is equal to said predefined nominal frequency.

11. A frequency modulator as claimed in claim 10 wherein the adjusting circuit further comprises:

a first digital counter controlled by a synchronization pulse and said second sequence of pulses, a second digital counter controlled by said first sequence of pulses, and a logic circuit controlled by output signals of the first and second digital counters to derive said first and second pulses for control of the first and second current sources.

12. A frequency modulator as claimed in claim 11 wherein said counters and logic circuit are arranged so that the first pulse is always longer than the second pulse within the permissible frequency deviation of the frequency modulator.

13. A frequency modulator as claimed in claim 1 wherein the capacitor is coupled to an input of the frequency modulator.

\* \* \* \* \*